(12) United States Patent
Sagawa

(10) Patent No.: US 10,942,226 B2
(45) Date of Patent: Mar. 9, 2021

(54) CABLE WITH RESIN COMPACT

(71) Applicant: Hitachi Metals, Ltd., Tokyo (JP)

(72) Inventor: Masanori Sagawa, Tokyo (JP)

(73) Assignee: Hitachi Metals, Ltd., Tokyo (JP)

(*) Notice: Subject to any disclaimer, the term of this patent is extended or adjusted under 35 U.S.C. 154(b) by 61 days.

(21) Appl. No.: 16/206,212

(22) Filed: Nov. 30, 2018

(65) Prior Publication Data

US 2019/0293727 A1    Sep. 26, 2019

(30) Foreign Application Priority Data

Mar. 22, 2018  (JP) .............................. JP2018-054725

(51) Int. Cl.
| | | |
|---|---|---|
| *G01R 33/00* | (2006.01) | |
| *H05K 5/02* | (2006.01) | |
| *H05K 5/00* | (2006.01) | |
| *H05K 3/32* | (2006.01) | |

(52) U.S. Cl.
CPC ....... *G01R 33/0047* (2013.01); *H05K 5/0004* (2013.01); *H05K 5/0217* (2013.01); *H05K 3/32* (2013.01)

(58) Field of Classification Search
CPC .. G01R 33/047; H05K 5/0004; H05K 5/0026; H05K 5/0034; H05K 5/0047; H05K 5/0217; H05K 5/0247; H05K 3/32; H05K 2201/10151; H05K 2201/0963; H02K 5/225; G01D 11/24; G01D 11/245

See application file for complete search history.

(56) References Cited

U.S. PATENT DOCUMENTS

| | | |
|---|---|---|
| 9,558,865 B2 | 1/2017 | Kataoka et al. |
| 10,069,237 B2 | 9/2018 | Lappoehn |
| 10,244,645 B2 | 3/2019 | Kang et al. |
| 10,288,730 B2 | 5/2019 | Tsuji et al. |

(Continued)

FOREIGN PATENT DOCUMENTS

| | | |
|---|---|---|
| CN | 2408585 Y | 11/2000 |
| CN | 102257374 A | 11/2011 |

(Continued)

OTHER PUBLICATIONS

Chinese Office Action dated Jan. 6, 2021 with English translation (11 pages).

*Primary Examiner* — Son T Le
*Assistant Examiner* — Dustin R Dickinson
(74) *Attorney, Agent, or Firm* — Crowell & Moring LLP

(57) ABSTRACT

A cable with a resin compact includes: a cable; a circuit board having one end on which a connecting portion connected to the cable is formed and the other end on which a sensor electrically connected to the cable through the connecting portion is formed; a holder housing the circuit board; and a cover member made of a resin partially covering the holder. The holder is partitioned by a first covered region surrounded by a first covering portion of the cover member, a second covered region surrounded by a second covering portion of the cover member, and a non-covered region not surrounded by the cover member. The first covered region, the non-covered region and the second covered region are aligned on a line in this order from a rear side toward a front side of the holder.

11 Claims, 4 Drawing Sheets

(56) References Cited

U.S. PATENT DOCUMENTS

| | | | | |
|---|---|---|---|---|
| 2010/0059654 A1* | 3/2010 | Gonzalez | ............ | G01R 33/072 |
| | | | | 248/682 |
| 2011/0290016 A1 | 12/2011 | Dietrich et al. | | |
| 2014/0355382 A1* | 12/2014 | Tsuji | ............... | G01S 15/04 |
| | | | | 367/87 |

FOREIGN PATENT DOCUMENTS

| | | |
|---|---|---|
| CN | 103502840 A | 1/2014 |
| CN | 104852205 A | 8/2015 |
| CN | 105304196 A | 2/2016 |
| CN | 107223293 A | 9/2017 |
| CN | 107432093 A | 12/2017 |
| JP | 2012-512405 A | 5/2012 |

\* cited by examiner

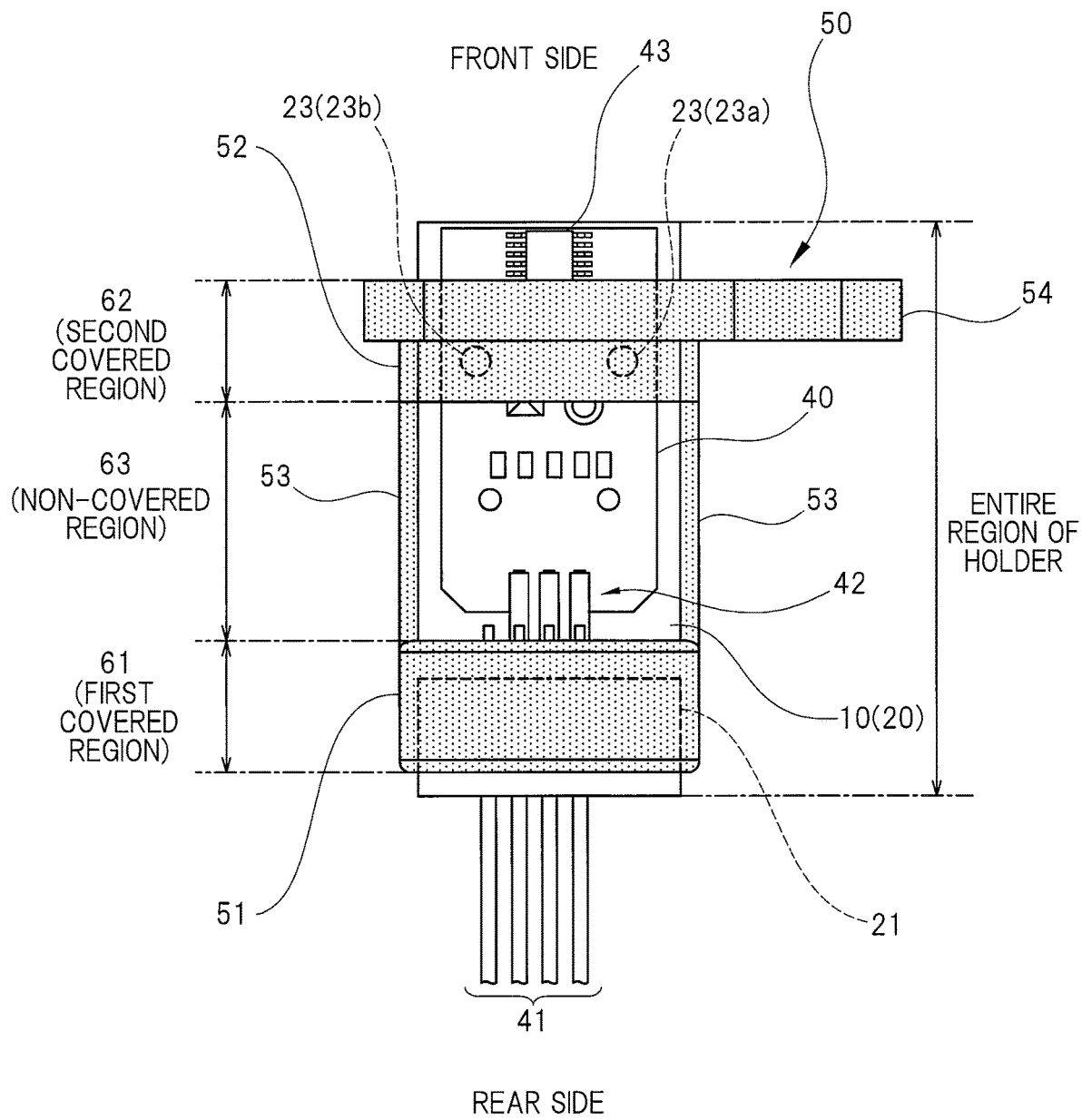

CABLE WITH RESIN COMPACT

CROSS-REFERENCE TO RELATED APPLICATION

The present application claims priority from Japanese Patent Application No. 2018-54725 filed on Mar. 22, 2018, the content of which is hereby incorporated by reference into this application.

TECHNICAL FIELD OF THE INVENTION

The present invention relates to a cable having a resin compact formed on its end portion.

BACKGROUND OF THE INVENTION

Nowadays, various cables such as a power cable and a communication cable are used in various fields. As one of such cables, a cable with a resin compact is cited, the cable having: a cable core; a sheath formed in periphery of the cable core; a circuit board connected to a tip of the cable core that protrudes from an end of the sheath; and a holder housing the sheath end, an exposed portion of the cable core, and the circuit board to which the cable conductor is connected. The cable of this type is used for, for example, in-vehicle sensors such as an ABS sensor, a torque sensor and an index sensor or others. In the following explanations, the sheath end, the exposed portion of the cable core and the circuit board are collectively referred to as "cable end" in some cases. That is, components housed in the holder are collectively referred to as "cable end" in some cases.

The holder is formed of a lower holder member and an upper holder member each of which is made of a resin, and the cable end is housed in a space between the lower holder member and the upper holder member that abut on each other.

RELATED ART DOCUMENT

Patent Document

Patent Document 1: Japanese Patent Application Laid-Open Publication (Translation of PCT Application) No. 2012-512405

SUMMARY OF THE INVENTION

In order to fix the lower holder member and the upper holder member that abut on each other and in order to reinforce the holder, the holder may be formed by resin molding. Specifically, the holder housing the cable end may be set inside a die, and a resin material may be supplied into the die where the holder is set, so that a cover member (referred to as "outer" in some cases) made of the resin may be formed.

However, when the cover member is formed as described above, there are risks of crush and deformation of the holder due to a pressure of the resin supplied into the die.

An object of the present invention is to provide a structure of a cable with a resin compact not causing the crush and the deformation of the holder at the time of molding of the cover member.

A cable with a resin compact of the present invention includes: a cable; a circuit board having one end on which a connecting portion connected with the cable is formed and having the other end on which a sensor electrically connected with the cable through the connecting portion is formed; a holder housing the circuit board; and a cover member made of a resin partially covering the holder. The holder is partitioned by a first covered region surrounded by one part of the cover member, a second covered region surrounded by the other part of the cover member, and a non-covered region not surrounded by the cover member. The first covered region, the non-covered region and the second covered region are aligned on a line in this order from a side on which the connecting portion is formed toward a side on which the sensor is formed.

In an aspect of the present invention, the cover member includes a first covering portion covering the first covered region of the holder, a second covering portion covering the second covered region of the holder, and a joint portion connecting the first covering portion and the second covering portion.

In another aspect of the present invention, the holder is formed of a lower holder member and an upper holder member that abut on each other. The joint portion of the cover member is formed on each of both side surfaces of the holder, and each joint portion covers a border between the lower holder member and the upper holder member.

In still another aspect of the present invention, a reinforcing member is formed inside the holder so as to pass through the circuit board and extend in a direction in which the lower holder member and the upper holder member face each other.

In still another aspect of the present invention, a flange monolithically formed with the cover member is formed, and a through hole in which a fixing tool is inserted is formed in the flange.

In still another aspect of the present invention, the flange is monolithically formed with a part of the cover member surrounding the second covered region of the holder.

In still another aspect of the present invention, the sensor is a magnetic sensor outputting a signal in accordance with change of a surrounding magnetic field.

According to the present invention, a structure of a cable with a resin compact not causing the crush and the deformation of the holder at the time of formation of the cover member is achieved.

BRIEF DESCRIPTIONS OF THE DRAWINGS

FIG. 4 is a plan view showing the holder and the cover member.

DESCRIPTIONS OF THE PREFERRED EMBODIMENTS

Hereinafter, one example of an embodiment of the cable with the resin compact of the present invention will be explained in detail with reference to the drawings. The cable with the resin compact according to the present embodiment includes: a cable; a circuit board connected to an end of the cable; a holder housing the end of the cable and the circuit board; and a cover member made of a resin partially covering the holder.

Figure 1:
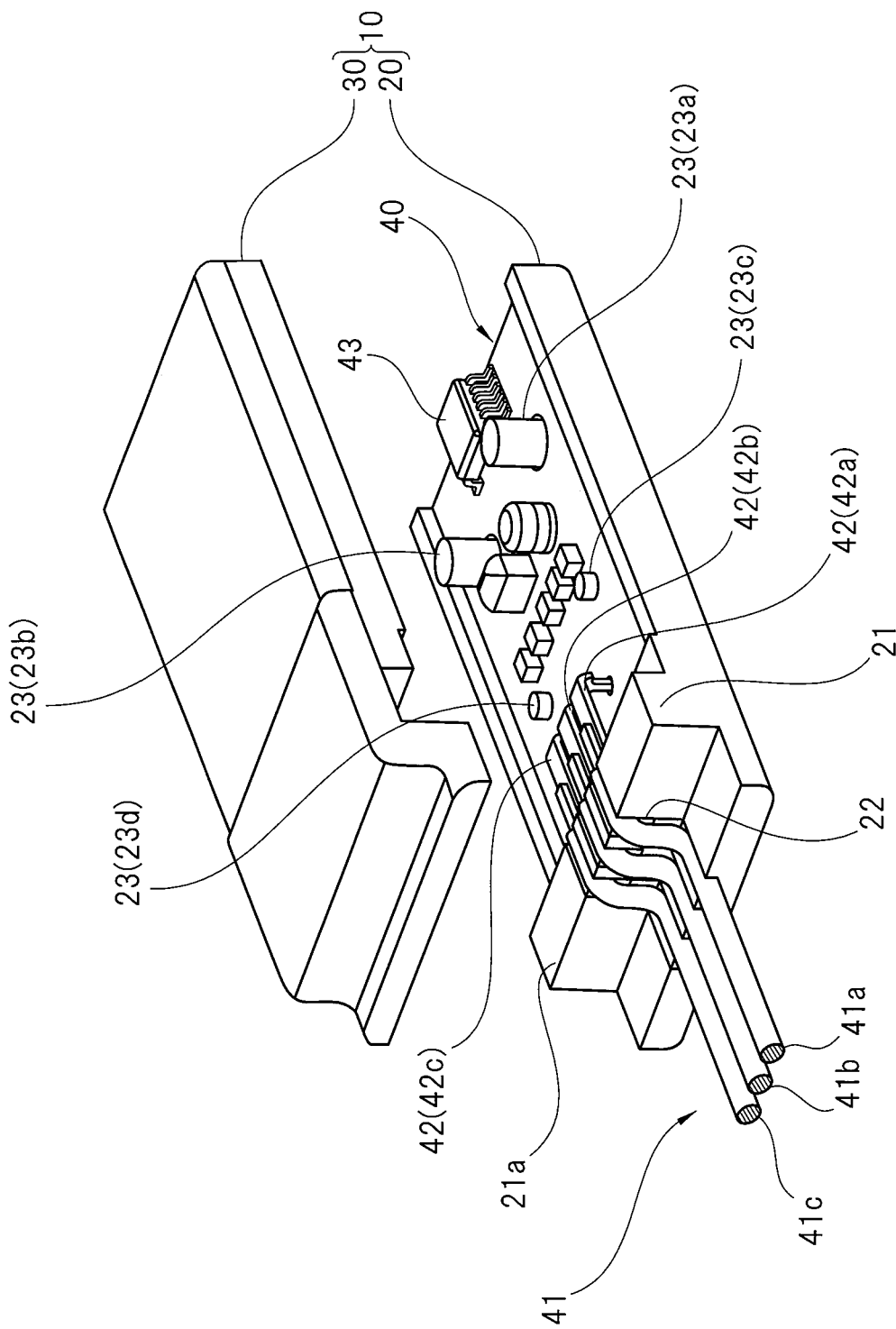
FIG. 1 is a perspective view showing a holder and an inside of the holder.
Figure 2:
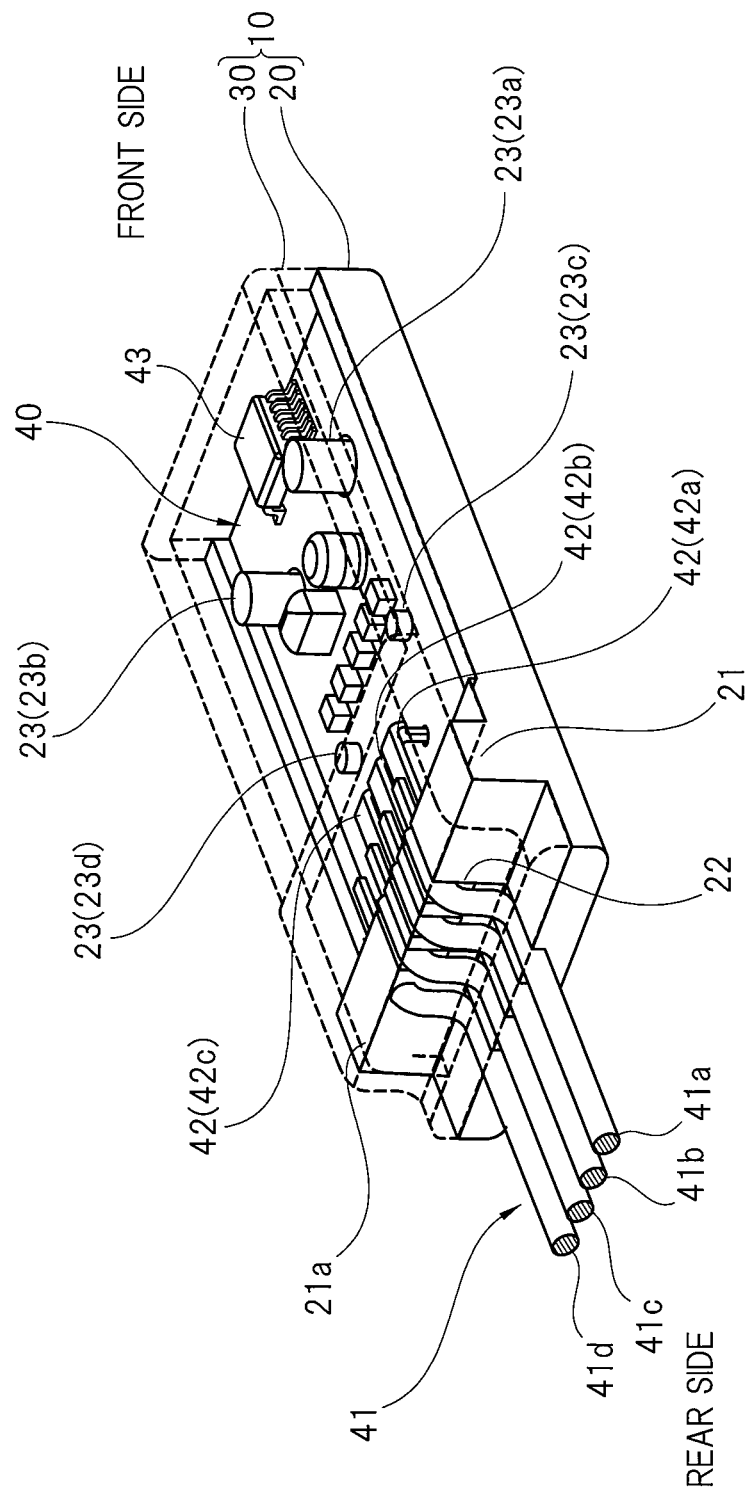
FIG. 2 is another perspective view showing the holder and the inside of the holder.

As shown in FIGS. 1 and 2, the holder 10 is formed of a lower holder member 20 and an upper holder member 30 that abut on each other, and has a flat shape as a whole. Each of the lower holder member 20 and the upper holder member 30 is made of the same resin material as each other. Each of the lower holder member 20 and the upper holder member 30 according to the present embodiment is made of polyamide (PA) that is one of resin materials.

A circuit board 40 is housed in the holder 10. Specifically, the circuit board 40 is placed on the lower holder member 20, and the upper holder member 30 is covered on the lower holder member 20 on which the circuit board 40 is placed. That is, the circuit board 40 is housed in a space between the lower holder member 20 and the upper holder member 30 that abut on each other. In other words, the holder 10 formed of the lower holder member 20 and the upper holder member 30 that abut on each other has a hollow structure having an internal space in which the circuit board 40 can be housed.

The circuit board 40 is a printed wiring board having a substantially rectangular plane shape. A connecting portion (terminal 42) to which a cable 41 is connected is formed on one end of the circuit board 40 in a longitudinal direction, and a sensor (sensor IC) 43 electrically connected to the cable 41 through the terminal 42 is formed on the other end of the same in the longitudinal direction. In other words, the terminal 42 functioning as a connecting portion is formed on one end side of the circuit board 40, and the sensor IC 43 functioning as a sensor is mounted on the other end side of the circuit board 40.

In the following explanations, the side on which the terminal 42 is formed among both sides of the circuit board 40 in the longitudinal direction is defined as a "rear side", and the side on which the sensor IC 43 is formed among the both sides is defined as a "front side". These definitions are applicable to not only the circuit board 40 but also the holder 10 and others unless otherwise particularly mentioned. That is, the same side as the rear side of the circuit board 40 among the both dies of the holder 10 in the longitudinal direction (that is the side on which the terminal 42 is formed) is a "rear side" of the holder 10, and the same side as the front side of the circuit board 40 among the both sides (that is the side on which the sensor IC 43 is formed) is a "front side" of the holder 10.

A stage 21 that is one level higher than other portions is formed on the rear side of the lower holder member 20, and the circuit board 40 is arranged on a front side of this stage 21. On an upper surface 21a of the stage 21, three grooves 22 in each of which the sheath end of the cable 41 is housed are formed in parallel to one another. A cable core protrudes from the sheath end of each cable 41, and a cable core of a predetermined cable 41 is connected to a predetermined terminal 42. In the present embodiment, three cables 41a, 41b and 41c are formed, a cable core of the cable 41a is connected to a terminal 42a, a cable core of the cable 41b is connected to a terminal 42b, and a cable core of the cable 41c is connected to a terminal 42c.

In the lower holder member 20, a columnar reinforcing member 23 that passes through the circuit board 40 and extends toward the upper holder member 30 is formed. Specifically, two front reinforcing members 23a and 23b are formed on a front side of a bottom surface of the lower holder member 20, and two rear reinforcing members 23c and 23d that are smaller in a diameter than the front reinforcing members 23a and 23b are formed on a rear side of the bottom surface of the lower holder member 20. An upper end surface of each reinforcing member 23 abuts on a top surface of the upper holder member 30 facing the bottom surface of the lower holder member 20, or faces the top surface through a very small space. That is, the reinforcing member 23 is interposed between the bottom surface of the lower holder member 20 and the top surface of the upper holder member 30, and prevents or reduces deflection and deformation of these bottom and top surfaces. In other words, the reinforcing member 23 prevents crash of the holder 10 in its thickness direction (equivalent to a direction in which the lower holder member 20 and the upper holder member 30 face each other) by an external force, or reduces a crash amount. Even if the holder 10 is crashed in the thickness direction for any reason, this prevents contact of the holder 10 with the sensor IC 43 and other electrical components on the circuit board 40. Further, the reinforcing member 23 passing through the circuit board 40 plays a role of positioning the circuit board 40 inside the holder 10.

Although illustration is omitted, a wiring pattern is formed on the circuit board 40, and the sensor IC 43 and the terminal 42 to which the cable 41 is connected are electrically connected to each other through this wiring pattern. Not only the terminal 42 and the sensor IC 43 but also various electrical components such as a capacitor and a diode are mounted on the circuit board 40. Note that the sensor IC 43 according to the present embodiment is a magnetic sensor IC that outputs a signal in accordance with change of a surrounding magnetic field.

Figure 3:
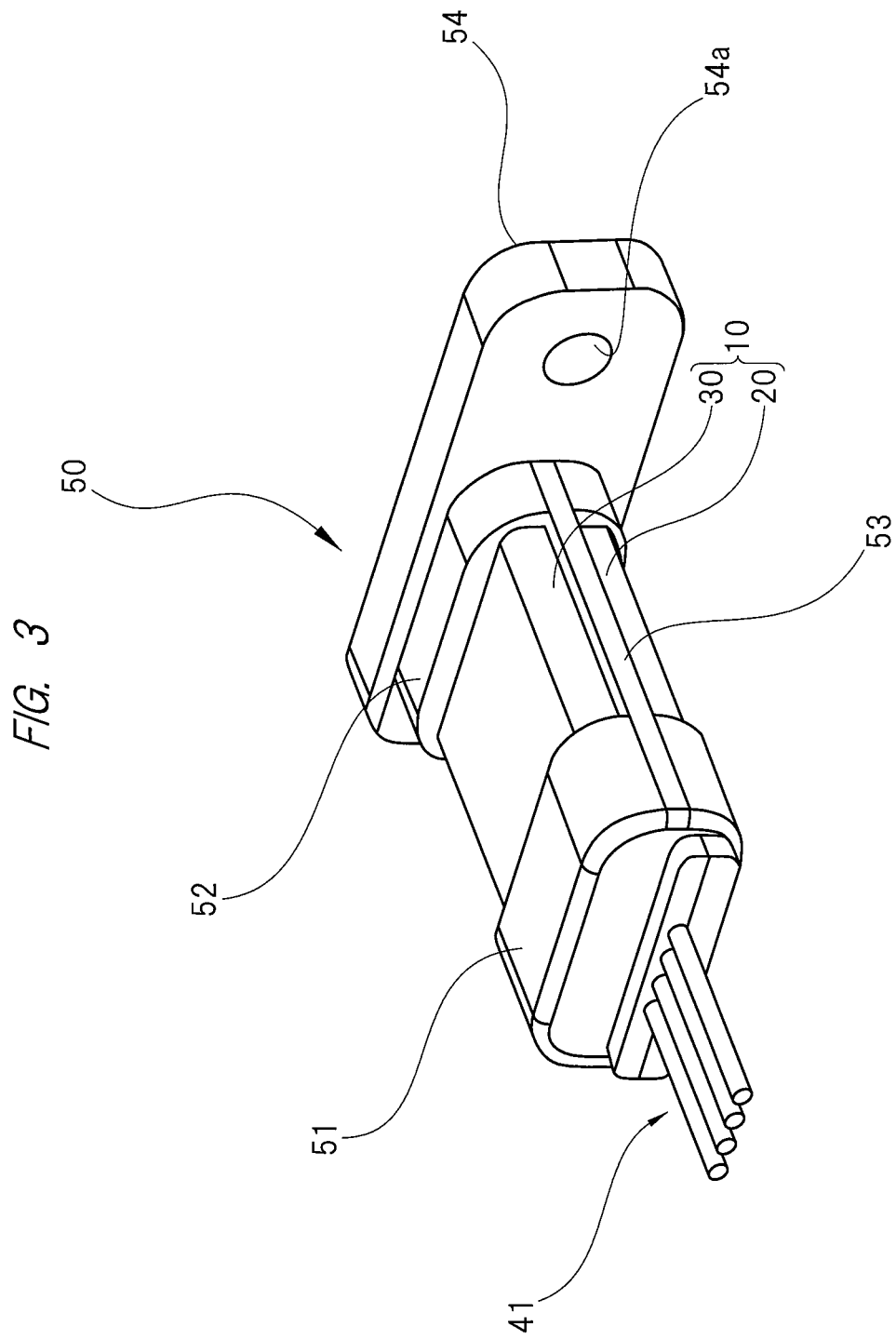
FIG. 3 is a perspective view showing the holder and a cover member.

As show in FIGS. 3 and 4, a cover member 50 made of a resin that partially covers the holder 10 is formed in periphery of the holder 10. This cover member 50 is formed by setting the holder 10 shown in FIG. 2 into a die, and supplying while pressurizing a resin material into the die where the holder 10 is being set. That is, a part of the holder 10 is formed by the resin molding.

As a result of the partial coverage on the holder 10 by the cover member 50, the holder 10 is partitioned by a first covered region 61 surrounded by one part of the cover member 50, a second covered region 62 surrounded by the other part of the cover member 50, and a non-covered region 63 not surrounded by the cover member 50 (see FIG. 4). As shown in FIG. 4, the first covered region 61, the non-covered region 63 and the second covered region 62 are aligned on a line in this order from the rear side of the holder 10 toward the front side of the same. In consideration of a relation between the circuit board 40 and the alignment of the first covered region 61, the non-covered region 63 and the second covered region 62, the first covered region 61, the non-covered region 63 and the second covered region 62 are aligned on a line in this order from the side on which the terminal 42 of the circuit board 40 is formed toward the side on which the sensor IC 43 is formed. In FIG. 4, note that the upper holder member 30 (FIGS. 1 and 2) is omitted in order to show inside of the holder 10. And, in order to clearly distinguish the cover member 50 and other members, the cover member 50 is added with a pattern (dot pattern).

FIGS. 3 and 4 will be referred to again. The cover member 50 that partially covers the holder 10 so as to partition the holder 10 into at least two covered regions and at least one non-covered region includes a first covering portion 51 covering the first covered region 61 of the holder 10, a second covering portion 52 covering the second covered region 62 of the holder 10, and a pair of joint portions 53 connecting the first covering portion 51 and the second covering portion 52. The first covering portion 51, the second covering portion 52 and the joint portions 53 are monolithically made of a resin material.

The first covering portion 51 of the cover member 50 is formed into a ring shape surrounding an entire circumference of the first covered region 61 of the holder 10. The second covering portion 52 of the cover member 50 is formed into a ring shape surrounding an entire circumference of the second covered region 62 of the holder 10. The pair of joint portions 53 are formed on both side surfaces of the holder 10, respectively. Each of the joint portions 53 is formed into a bar shape, and extends over the first covering portion 51 and the second covering portion 52 along the side surface of the holder 10. Specifically, one end of the joint portion 53 is connected to the first covering portion 51, and the other end of the joint portion 53 is connected to the second covering portion 52. The joint portion 53 covers the border between the lower holder member 20 and the upper holder member 30 and extends along the border.

A flange 54 is monolithically formed with the cover member 50. Specifically, the flange 54 is monolithically formed with the second covering portion 52 of the cover member 50. One end of the flange 54 protrudes from the second covering portion 52 toward a lateral side, and a through hole 54a is formed in this protruding portion. In the through hole 54a, a fixing tool (for example, bolt) for fixing the holder 10 to a fixed object is inserted.

As described above, in the present embodiment, the holder 10 is partially covered by the cover member 50. In other words, the cover member 50 covers only a part of the holder 10, but does not entirely cover the holder. Therefore, when the resin material is pressurized and supplied to a periphery of the holder 10 set in the die to form the cover member 50, a resin pressure applied to the holder 10 is reduced, so that the crash and the deformation of the holder 10 are prevented.

Further, in the present embodiment, inside the first covered region 61 of the holder 10 covered by the cover member 50 (the first covering portion 51), the stage 21 that is one level higher than other portions is formed. Inside the second covered region 62 of the holder 10 covered by the cover member 50 (the second covering portion 52), the front reinforcing members 23a and 23b are formed. That is, a region to which the resin pressure is applied at the time of formation of the cover member 50 is reinforced. In other words, while a reinforced region of the holder 10 is covered by the cover member 50, a not-reinforced region of the holder 10 is not covered by the cover member 50.

As described above, while a relatively strong region of the holder 10 is covered by the cover member 50, a relatively weak region of the holder 10 is not covered by the cover member 50. Therefore, while the crash and the deformation of the holder 10 due to the resin pressure at the time of formation of the cover member are prevented, the lower holder member 20 and the upper holder member 30 are sufficiently fixed to each other by the cover member 50. And, while the crash and the deformation of the holder 10 due to the resin pressure at the time of formation of the cover member are prevented, the cover member 50 that can sufficiently protect the holder 10 is formed.

The present invention is not limited to the foregoing embodiments and various modifications can be made within the scope of the present invention. For example, each material for the holder and the cover member is not limited to a specific material. And, the holder and the cover member may be made of the same resin material as or a different resin material from each other. As each material for the holder and the cover member, for example, polybutylene terephthalate (PBT) is cited.

The terminal functioning as the connecting portion formed on the circuit board can be replaced with a connector. In this case, a connector that is connectable to the connector formed on the circuit board is formed on an end portion of the cable. The sensor formed on the circuit board is replaced with a sensor other than the magnetic sensor in accordance with application of the cable with the resin compact.

What is claimed is:

1. A cable with a resin compact comprising:
   a cable;
   a circuit board having one end on which a connecting portion connected to the cable is formed and the other end on which a sensor electrically connected to the cable through the connecting portion is formed;
   a holder housing the circuit board; and
   a cover member insert-molded around the holder and made of a resin partially covering the holder,
   wherein the holder is partitioned by a first covered region surrounded by a first covering portion of the cover member, a second covered region surrounded by a second covering portion of the cover member, and a middle region positioned between the first covered region and the second covered region,
   the first covered region, the middle region and the second covered region are aligned on a line in this order from a side on which the connecting portion is formed toward a side on which the sensor is formed, and
   the middle region is exposed from the first covering portion and the second covering portion.

2. The cable with the resin compact according to claim 1, wherein the cover member includes:
   a joint portion connecting the first covering portion and the second covering portion, and
   the joint portion covers a part of the middle region of the holder.

3. The cable with the resin compact according to claim 2, wherein the holder is formed of a lower holder member and an upper holder member that abut on each other, and
   the joint portion of the cover member is formed on each of both side surfaces of the holder, and
   each of the joint portions cover a border between the lower holder member and the upper holder member.

4. The cable with the resin compact according to claim 3, further comprising
   a reinforcing member formed inside the holder so as to pass through the circuit board and extend in a direction in which the lower holder member and the upper holder member face each other.

5. The cable with the resin compact according to claim 4, wherein the reinforcing member is arranged in the second covered region of the holder covered by the second covering portion of the cover member.

6. The cable with the resin compact according to claim 3, wherein the lower holder member has a stage that is one level higher than other portions,
   the upper holder member has a concave portion in which the stage of the lower holder member is encapsulated, and
   the stage of the lower holder member and the concave portion of the upper holder member are arranged in the first covered region of the holder covered by the first covering portion of the cover member.

7. The cable with the resin compact according to claim 6, wherein the circuit board is arranged in front of the stage of the lower holder member.

8. The cable with the resin compact according to claim 6, wherein a groove is formed in an upper surface of the stage of the lower holder member, and
   the cable is housed in the groove formed in the upper surface of the stage, and is routed in a bending state.

9. The cable with the resin compact according to claim 1, further comprising
  a flange monolithically formed with the cover member,
  wherein a through hole in which a fixing tool is inserted is formed in the flange.

10. The cable with the resin compact according to claim 9,
  wherein the flange is monolithically formed with the second covering portion of the cover member surrounding the second covered region of the holder.

11. The cable with the resin compact according to claim 1,
  wherein the sensor is a magnetic sensor outputting a signal in accordance with change of a surrounding magnetic field.

\* \* \* \* \*